United States Patent
Cheng et al.

(10) Patent No.: US 8,569,105 B2
(45) Date of Patent: Oct. 29, 2013

(54) PASSIVATING GLUE LAYER TO IMPROVE AMORPHOUS CARBON TO METAL ADHESION

(75) Inventors: Siu F. Cheng, Los Angeles, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/456,058

(22) Filed: Apr. 25, 2012

(65) Prior Publication Data

US 2012/0208339 A1 Aug. 16, 2012

Related U.S. Application Data

(63) Continuation of application No. 12/566,948, filed on Sep. 25, 2009, now Pat. No. 8,278,139.

(51) Int. Cl.
*H01L 21/00* (2006.01)

(52) U.S. Cl.
USPC .............. 438/104; 438/623; 438/628; 257/4; 257/E45.003; 257/E21.006

(58) Field of Classification Search
USPC ............ 438/623, 102, 104, 105, 95, 99, 628, 438/382, 384; 257/4, E45.001, E45.002, 257/E45.003, E21.003, E21.004, E21.005, 257/E21.006
See application file for complete search history.

(56) References Cited

U.S. PATENT DOCUMENTS

| | | | | |
|---|---|---|---|---|
| 4,240,869 A | * | 12/1980 | Diepers | 216/20 |
| 4,601,807 A | * | 7/1986 | Lo et al. | 204/298.33 |
| 4,918,032 A | * | 4/1990 | Jain et al. | 438/52 |
| 5,275,882 A | * | 1/1994 | Conley | 428/336 |
| 5,372,677 A | * | 12/1994 | Katayama et al. | 438/703 |
| 5,552,373 A | * | 9/1996 | Agostinelli et al. | 505/190 |
| 5,601,902 A | * | 2/1997 | Hammerschmidt et al. | 428/209 |
| 5,710,070 A | * | 1/1998 | Chan | 438/21 |
| 5,985,750 A | * | 11/1999 | Oda | 438/623 |
| 6,096,645 A | * | 8/2000 | Lo et al. | 438/680 |
| 6,436,819 B1 | * | 8/2002 | Zhang et al. | 438/656 |
| 6,544,882 B1 | | 4/2003 | Liu et al. | |

(Continued)

FOREIGN PATENT DOCUMENTS

| | | |
|---|---|---|
| JP | 2008-235729 A | 10/2008 |
| JP | 2009-049183 A | 3/2009 |
| KR | 2003-0059493 A | 7/2003 |
| KR | 2006-0132038 A | 12/2006 |

OTHER PUBLICATIONS

International Search Report and Written Opinion of the International Searching Authority mailed Mar. 31, 2011 in PCT/US2010/048447.

*Primary Examiner* — Mary Wilczewski
(74) *Attorney, Agent, or Firm* — Patterson & Sheridan, LLP

(57) ABSTRACT

A method and apparatus is provided for forming a resistive memory device having good adhesion among the components thereof. A first conductive layer is formed on a substrate, and the surface of the first conductive layer is treated to add adhesion promoting materials to the surface. The adhesion promoting materials may form a layer on the surface, or they may incorporate into the surface or merely passivate the surface of the first conductive layer. A variable resistance layer is formed on the treated surface, and a second conductive layer is formed on the variable resistance layer. Adhesion promoting materials may also be included at the interface between the variable resistance layer and the second conductive layer.

1 Claim, 6 Drawing Sheets

(56) References Cited

U.S. PATENT DOCUMENTS

| | | |
|---|---|---|
| 6,744,088 B1 | 6/2004 | Dennison |
| 7,056,825 B2 | 6/2006 | Yoneda et al. |
| 7,087,919 B2 | 8/2006 | Campbell et al. |
| 7,151,273 B2 | 12/2006 | Campbell et al. |
| 7,273,808 B1 | 9/2007 | Lin |
| 7,326,979 B2 | 2/2008 | Rinerson et al. |
| 7,402,851 B2 | 7/2008 | Hideki et al. |
| 7,456,420 B2 | 11/2008 | Cote et al. |
| 7,646,007 B2 | 1/2010 | Campbell et al. |
| 7,723,713 B2 | 5/2010 | Campbell et al. |
| 8,012,789 B2 | 9/2011 | Ko et al. |
| 8,084,761 B2 | 12/2011 | Lee et al. |
| 8,278,139 B2 * | 10/2012 | Cheng et al. ................ 438/102 |
| 8,288,295 B2 * | 10/2012 | Oku et al. ................... 438/783 |
| 2003/0155589 A1 | 8/2003 | Campbell et al. |
| 2004/0192006 A1 | 9/2004 | Campbell et al. |
| 2004/0248395 A1 | 12/2004 | Yoneda et al. |
| 2005/0029502 A1 | 2/2005 | Hudgens |
| 2006/0278900 A1 | 12/2006 | Chang et al. |
| 2007/0007506 A1 | 1/2007 | Campbell et al. |
| 2007/0102691 A1 | 5/2007 | Campbell et al. |
| 2007/0121363 A1 | 5/2007 | Lung |
| 2007/0274121 A1 | 11/2007 | Lung et al. |
| 2009/0065760 A1 | 3/2009 | Lee et al. |
| 2009/0140232 A1 | 6/2009 | Ufert |
| 2009/0190388 A1 | 7/2009 | Bruchhaus et al. |
| 2009/0321706 A1 | 12/2009 | Happ et al. |
| 2011/0233502 A1 | 9/2011 | Shigeoka et al. |
| 2011/0315946 A1 | 12/2011 | Ko et al. |
| 2012/0032133 A1 | 2/2012 | Miller et al. |
| 2012/0043518 A1 | 2/2012 | Cheng et al. |

* cited by examiner

PASSIVATING GLUE LAYER TO IMPROVE AMORPHOUS CARBON TO METAL ADHESION

CROSS-REFERENCE TO RELATED APPLICATIONS

This application is a continuation of U.S. patent application Ser. No. 12/566,948, filed Sep. 25, 2009, and published Mar. 21, 2011, as U.S. Patent Publication 2011/0076826, which is incorporated herein by reference.

FIELD

Embodiments described herein generally relate to manufacture of semiconductor devices. More specifically, embodiments described herein relate to manufacture of memory devices.

BACKGROUND

Non-volatile electronic memory devices are used in a wide variety of consumer goods. Available in mechanically-addressed forms and electrically-addressed forms, non-volatile or static memory devices generally rely on one or more properties of a material that can be altered by application of electrical energy, but will not change unless such energy is applied. Examples of mechanically-addressed static memory systems include magnetic tape drives, hard disk drives and optical drives. Examples of electrically-addressed devices in wide use today include flash memory devices, SRAM, as well as older forms of read-only memory.

Resistive memory is a developing form of electrically-addressed static memory. A material having variable resistance is disposed between two conductive materials. When a voltage is applied across the variable resistance material, the internal structure of the material changes permanently, resulting in a change to the electrical properties of the material, specifically its resistivity. This change in resistivity may be detected and treated as stored information.

Adhesion of the various components of a resistive memory device is a challenge that must be overcome to manufacture devices that are reliable under temperature and load cycling conditions. Some materials that may be attractive for reasons of electrical performance do not adhere well when assembled in a device.

Thus, there remains a need for methods and apparatus for forming reliable, durable memory devices.

SUMMARY

Embodiments described herein provide a method of forming a device, comprising forming a first conductive layer on a substrate, forming a resistive layer in contact with the conductive layer, improving the adhesion of the resistive layer to the conductive layer by treating a surface of the conductive layer, and forming a second conductive layer over the resistive layer.

Other embodiments provide a method of forming an electronic memory device, comprising forming a variable resistance layer on a nitrogen-rich surface of a first metal contact, and forming a second metal contact over the variable resistance layer.

Still other embodiments provide a method of forming an electronic memory device, comprising forming a first conductive layer on a substrate, exposing the first conductive layer to a plasma to incorporate a bonding material into a surface of the first conductive layer, depositing a resistive memory layer on the surface of the first conductive layer, and forming a second conductive layer on the resistive memory layer.

BRIEF DESCRIPTION OF THE DRAWINGS

So that the manner in which the above-recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
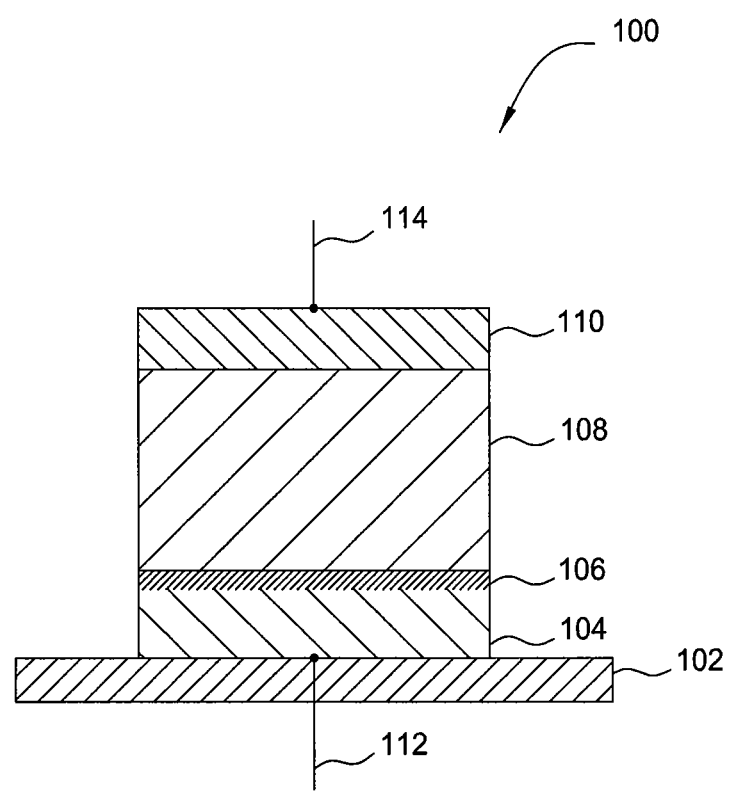
FIG. 1 is a schematic cross-sectional view of a device according to one embodiment.

Embodiments of the invention generally provide methods of forming memory devices. A memory device employing variable resistance for recording information, sometimes known as a resistive memory or MIM device, generally comprises two conductive contact layers with a resistive layer between. A schematic cross-section of such a device 100 is shown in FIG. 1. A structural substrate 102 forms the basis of the device 100. The substrate 102 may be any material known to the art that is generally used for forming electronic devices. A first conductive layer 104, which may be a metal, metal alloy, conductive metal compound, or conductive polymer, is formed on the substrate by physical or chemical vapor deposition by any process known to the art. The resistive layer 108 is formed on the first conductive layer 104, typically by a chemical vapor deposition process, and the second conductive layer 110 is formed on the resistive layer 108. Contacts 112 and 114 connect the first and second conductive layers 104 and 110 to respective external circuits.

The resistive layer 108 is generally formed from a material having a variable resistivity to electrical current. The resistivity of a candidate material typically changes when an electric or magnetic field is applied due to changes in the microscopic structure of the resistive material. In some embodiments, the resistivity of an oxide material may change as the configuration of defects in the crystal structure adjusts under stimulus by an electric field. In other embodiments, an amorphous carbon material, or a doped amorphous carbon material, may similarly reconfigure to provide alternative conductive pathways. As the internal structure of the resistive layer cycles among different configurations, adhesion to adjacent layers may be weakened.

In the embodiment of FIG. 1, the first conductive layer 104 has a treated surface 106 that enhances adhesion of the resistive layer 108 to the first conductive layer 104. The treated surface 106 generally comprises one or more materials added to the surface of the first conductive layer 104 to provide a mechanism for enhanced adhesion of the resistive layer 108. In one embodiment, the treated surface 106 provides a bonding layer for enhanced adhesion, while in another embodiment, the treated surface 106 provides a solution layer for enhanced adhesion.

Figure 2:
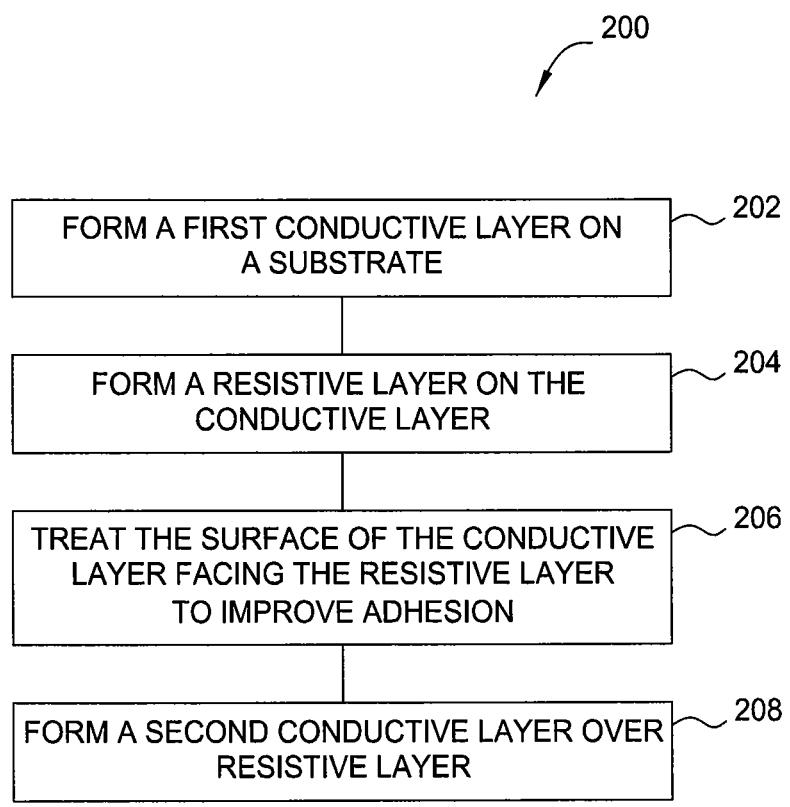
FIG. 2 is a flow diagram summarizing a method according to another embodiment.

FIG. 2 is a flow diagram summarizing a method 200 according to one embodiment. The method 200 may be used to form devices such as the device 100 of FIG. 1. At 202, a first conductive layer is formed on a substrate. The first conductive layer may be a substantially pure metal, such as copper, aluminum, nickel, platinum, titanium, tungsten, silver, gold, or zinc, or a mixture or alloy of any of those metals. The first conductive layer may also be a conductive metal compound, such as a conductive metal oxide or nitride. The first conductive layer will generally have a thickness of between about 20 Å and about 1,000 Å, such as between about 50 Å and about 500 Å, for example about 100 Å. The first conductive layer may be formed by any commonly used process for depositing layers on substrates, such as physical vapor deposition or chemical vapor deposition with or without plasma assistance.

A resistive layer is formed on the conductive layer at 204. The resistive layer will generally be a material whose resistivity can be permanently changed by applying an electric or magnetic field. In some embodiments, the resistive layer may be a metal oxide layer. In other embodiments, the resistive layer may be a doped or undoped amorphous carbon layer. The resistive layer will generally have a thickness between about 100 Å and about 5,000 Å, such as between about 300 Å and about 1,000 Å, for example about 500 Å. The resistive layer may also be deposited by physical or chemical vapor deposition with or without plasma assistance.

To improve adhesion of the resistive layer to the first conductive layer, the surface of the first conductive layer facing the resistive layer is treated at 206. The surface is exposed to an adhesion promoting material that changes the affinity of atoms at the surface of the first conductive layer for the material of the resistive layer. In some embodiments, exposure to the adhesion promoting material passivates the surface of the first conductive layer with respect to the resistive layer. In one embodiment, the surface of the first conductive layer becomes a bonding surface, with atoms at the surface of the first conductive layer forming chemical bonds with atoms of the resistive material. In one example, the surface of the first conductive layer may be treated with an oxygen and/or nitrogen containing gas to adsorb oxygen and/or nitrogen atoms onto the surface for bonding with metal atoms in a resistive metal oxide layer. In another embodiment, the treated surface of the first conductive layer forms a solution boundary between the first conductive layer and the resistive layer, providing improved adhesion by allowing atoms of the resistive material to intermingle with atoms of the first conductive layer at the solution boundary. Nitrogen atoms may be adsorbed onto the surface of the first conductive layer before applying a carbon containing resistive layer to create a solution boundary for the carbon/metal interface.

The adhesion promoting materials on the surface of the first conductive layer may form a layer up to about five monolayers thick, which may have a thickness less than about 10 Å. The layer may be continuous or discontinuous. For example, some portions of the surface may be saturated with adhesion promoting materials, while other portions are not. Saturation with adhesion promoting materials may vary from about 20% at some locations of the surface to 100% at other locations. The average saturation of the entire surface with adhesion promoting materials may vary between about 50% and about 100%, such as between about 75% and about 100%, for example about 98% or more.

At 208, a second conductive layer is formed over the resistive layer to complete the memory cell. The second conductive layer may also be a substantially pure metal, a mixture or alloy of metals, or a conductive metal compound, similar to the first conductive layer. In some embodiments, the second conductive layer may be substantially the same as the first conductive layer in composition and thickness, and may be deposited by physical or chemical vapor deposition, with or without plasma assistance. In some embodiments, adhesion may be enhanced by incorporating adhesion promoting materials at the interface between the resistive layer and the second conductive layer, for example by pulsing one or more precursors containing the adhesion promoting materials into the reaction mixture near the beginning of depositing the second conductive layer. In an embodiment featuring a carbon resistive layer, nitrogen may be added to the reaction mixture while depositing the second conductive layer by adding nitrogen containing precursors such as $N_2$ or $NH_3$ to the reaction mixture.

Figure 3A:
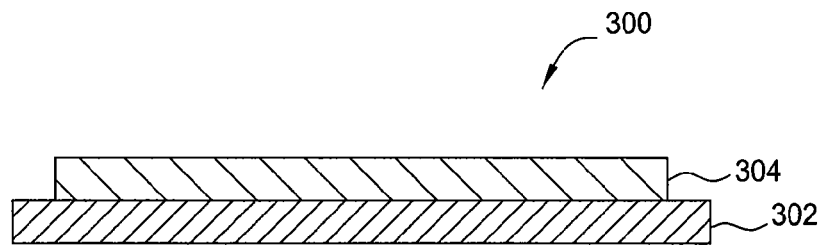
FIGS. 3A-3E are schematic cross-sectional views of a device at various stages of the method of FIG. 2.
Figure 3B:
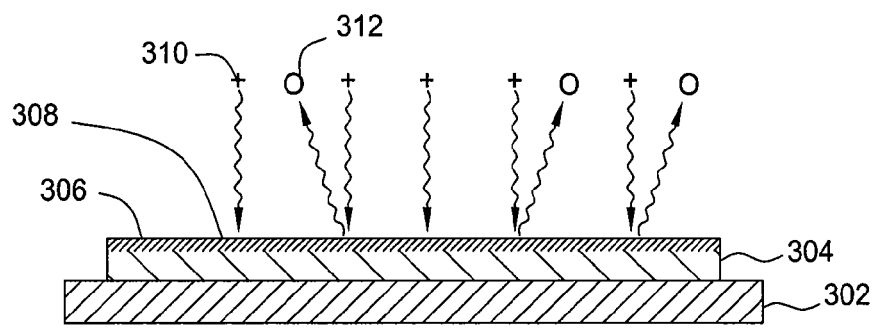

FIGS. 3A-3E are schematic cross-sectional views of a device at various stages of the method 200 of FIG. 2. In FIG. 3A, a device 300, comprising a structural substrate 302 and a first conductive layer 304 is shown. FIG. 3B shows the device 300 undergoing a surface treatment to form a treated surface 306 of the first conductive layer 304. In FIG. 3B, the device 300 is being treated with ions 310 formed by applying ionizing energy to a process gas. The ionizing energy may be any form of energy applicable to ionizing a gas, such as virtually any form of electromagnetic energy. The gas may be ionized by applying an electric field or a magnetic field, either of which may be static or varying. The gas may be ionized by applying a DC, pulsed DC, or RF electric field in-situ or remotely. Similarly, the gas may be ionized by applying a magnetic field, which may be an inductive field, in-situ or remotely. In another embodiment, the gas may be ionized by applying UV, microwave, or thermal radiation in-situ or remotely. In one embodiment, an RF varying electric field is coupled into the process chamber being used to treat the surface of the first conductive layer 304 to ionize a process gas.

Figure 3C:
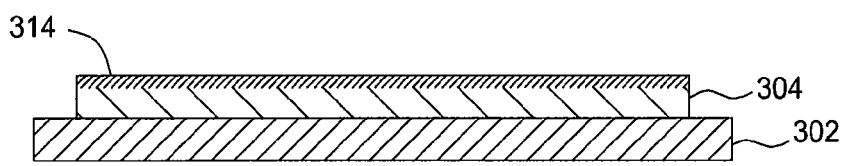

The device 300 may have a native layer containing oxygen prior to surface treatment. In some embodiments, the ions 310 may strike the surface 308 of the first conductive layer 304 with sufficient energy to dislodge oxygen atoms, ions, or radicals 312. In some embodiments, the ions 310 may implant some distance into the surface of the first conductive layer 304, for example up to about 20 Å deep. In FIG. 3C, the device 300 is shown with the treated surface 314 of the first conductive layer 304.

Figure 3D:
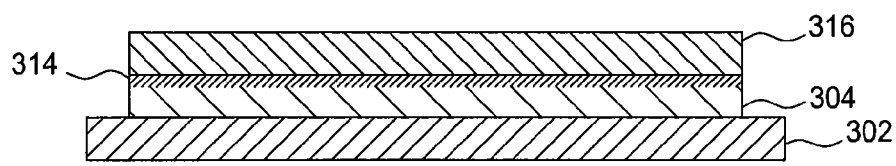

FIG. 3D shows the device 300, with a resistive layer 316 deposited on the treated surface 314 of the first conductive layer 304. The resistive layer 316 may be a metal oxide layer or carbon containing layer, such as amorphous carbon or doped amorphous carbon, with variable resistance properties. The resistive layer 316 may be formed by physical or chemical vapor deposition, with or without plasma assistance.

The selection of deposition process for the resistive layer 316 may be influenced by the degree and character of bonding or adhesion desired between the resistive layer 316 and the treated surface 314 of the first conductive layer 304, as well as process considerations. Processes that rely on directed particle motion and impact with the substrate, such as plasma CVD processes wherein the substrate is biased, will drive the material of the resistive layer 316 into the treated surface 314 of the first conductive layer 304, potentially producing a relatively thick transition layer, for example between about 50 Å and about 100 Å, with composition potentially including material from the first conductive layer 304, the treated surface 314, and the resistive layer 316. Adhesion may be stronger, but the resistive layer 316 may need to be thicker to compensate for high conductivity of the transition layer. Processes that feature lower impact energy, such as thermal CVD and PVD processes, may provide a thinner transition layer, for example less than about 20 Å, between the first conductive layer 304 and the resistive layer 316.

In alternate embodiments, depending on specific parameters of the ion treatment, the treated surface 314 may comprise one or more of an interface layer, a bonding layer, a solution layer, an implant layer, or a blend layer. An interface layer will generally have a first portion in which the adhesion promoting material blends with material from the surface of the first conductive layer 304, a second portion of substantially unblended adhesion promoting material, and a third portion in which the adhesion promoting material blends with material from the surface of the resistive layer 316 after the resistive layer 316 is formed. A bonding layer, as described above, provides chemical bonding with material of the resistive layer 316. A solution layer, as also described above, provides solubility for material from the resistive layer 316, which adheres the resistive layer 316 to the first conductive layer 304. An implant layer results from a treated surface 314 of the first conductive layer 304 that comprises a blend of material from the first conductive layer 304 and the adhesion promoting material used to treat the surface 306 of the first conductive layer 304. In an impact layer, a concentration of the adhesion promoting material may be highest below the treated surface 314, for example less than about 20 Å. An implant layer will provide a thicker transition layer between the first conductive material 304 and the resistive material 316, as well. A blend layer will feature a smooth transition in composition from the first conductive layer 304 to the resistive layer 316.

Figure 3E:
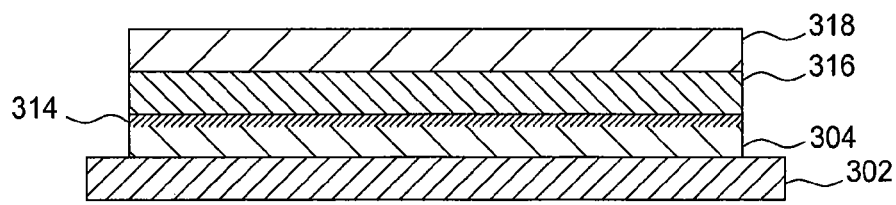

A second conductive layer 318 is applied to the resistive layer 316 in FIG. 3E to complete the functional core of the device 300. The second conductive layer 318 may be a metal, metal mixture, metal alloy, conductive metal compound, or conductive or semi-conductive non-metal. The second conductive layer 318 may be formed by a physical or chemical vapor deposition process, with or without plasma assistance, or by a plating process. The second conductive layer 318 may be the same material as the first conductive layer 304, or a different material, and may be formed in the same chamber as the first conductive layer 304, or in a different chamber. To promote adhesion of the second conductive layer 318 to the resistive layer 316, an adhesion promoting material may be added to the deposition mixture at the beginning of the process for depositing the second conductive layer 318. The adhesion promoting material may be pulsed into the deposition mixture to form a thin adhesion layer between the resistive layer 316 and the second conductive material 318. The adhesion promoting material may be a nitrogen or oxygen containing material, and may be the same as the adhesion promoting material used to treat the surface of the first conductive layer 304.

Figure 4:
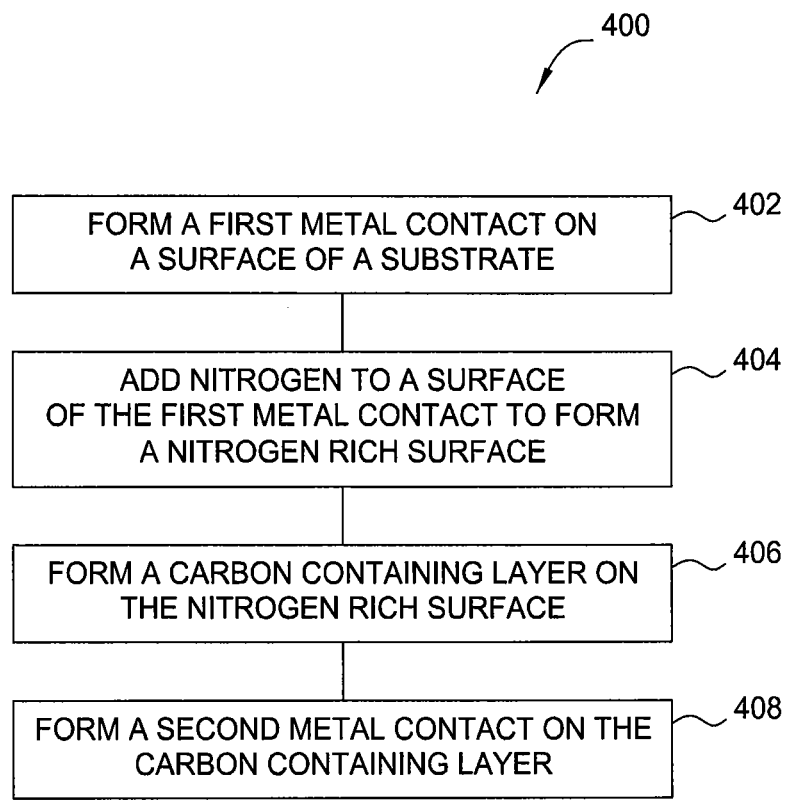
FIG. 4 is a flow diagram summarizing a method according to another embodiment.

FIG. 4 is a flow diagram summarizing a method 400 according to another embodiment. At 402, a first metal contact is formed on a surface of a structural substrate. The structural substrate may be any substrate commonly used in forming electronic devices, as described above. The metal contact may be formed by a PVD or CVD process, with or without plasma assistance, and may be a substantially pure metal, a metal mixture or alloy, or a conductive metal compound such as a metal oxide or nitride. In some embodiments, the first metal contact may comprise a plurality of layers, each layer having substantially the same composition as one or more other layers, or a different composition. In one embodiment, the first metal contact may be a bilayer of two different metal compositions, each layer of which may be a substantially pure metal or a metal mixture or alloy. Metals that may be incorporated into the first metal contact include copper, aluminum, nickel, zinc, tantalum, titanium, cobalt, silver, gold, platinum, chromium, and tungsten.

At 404, nitrogen is added to a surface of the first metal contact to form a nitrogen rich surface. The substrate is disposed in a processing chamber configured to expose the substrate to a nitrogen containing gas. The nitrogen containing gas may be ionized in the chamber by coupling an inductive or capacitative electric field into the chamber processing space. Nitrogen containing ions formed thereby may be encouraged to deposit on, or impact with, the surface of the first metal contact by biasing the substrate. The nitrogen containing ions occupy adsorption sites on the surface of the first metal contact, and some nitrogen containing ions embed or implant into the surface of the first metal contact, depending on the substrate bias energy. A weak bias, such as an RF bias between about 100 V and about 500 V, root-mean-square, at a power level less than about 500 Watts, may be used for a shallow surface treatment with nitrogen containing ions. In some embodiments, the nitrogen containing ions may deposit on the surface of the first metal contact to an average depth of less than about 5 monolayers. In other embodiments, the nitrogen containing ions may deposit to an average depth less than about 10 Å.

In one embodiment, nitrogen may be added to the surface of a metal contact by exposing the surface to a plasma comprising nitrogen. A nitrogen containing gas mixture is provided to a process chamber through a gas distributor, and the substrate is disposed on a substrate support within the process chamber. The substrate support, the gas distributor, or both, are coupled to a source of electrical energy, which may be DC, pulsed DC, or RF energy provided through an impedance matching circuit. The electrical energy ionizes the nitrogen containing gas mixture into a plasma, which interacts with the surface of the metal contact. The nitrogen containing gas mixture may comprise nitrogen gas ($N_2$), ammonia ($NH_3$), nitrous oxide ($NO_2$) or hydrazine ($H_2N_2$), and may further comprise a carbon containing gas such as methane ($CH_4$), ethane ($C_2H_6$), ethylene ($C_2H_4$), or acetylene ($C_2H_2$). Including carbon in the nitrogen containing gas mixture may be advantageous for embodiments in which the resistive layer comprises amorphous carbon or doped amorphous carbon.

The nitrogen containing gas mixture is generally provided to the process chamber at a flow rate between about 10 sccm and about 10,000 sccm, such as between about 500 sccm and about 8,500 sccm, for example between about 7,500 sccm and about 8,500 sccm, or between about 3,500 sccm and about 4,500 sccm, or between about 1,500 sccm and about 2,500 sccm, or between about 500 sccm and about 1,500 sccm. Adhesion may be controlled by exposure time, which may influence degree of saturation of the surface of the metal contact layer with nitrogen, or by the volumetric ratio of nitrogen containing species to nitrogen-free species or to the total gas mixture.

In one embodiment, a tungsten surface may be treated by exposure to a gas mixture comprising nitrogen gas ($N_2$) and acetylene ($C_2H_2$) at a volumetric ratio of $N_2/C_2H_2$ of between about 1:1 and about 40:1, such as between about 1:1 and about 20:1, or between about 20:1 and about 40:1, or between about 1:1 and about 5:1, or between about 5:1 and about 10:1, or between about 10:1 and about 20:1, or between about 20:1 and about 40:1. Plasma generation power is provided at between about 1,000 W and about 5,000 W, such as between about 1,500 W and about 3,000 W. Exposure to such conditions for a time between about 10 sec. and about 500 sec., such as between about 50 sec. and about 250 sec., for example between about 100 sec. and about 200 sec, improves adhesion of a carbon containing layer to the tungsten surface. In one embodiment, nitrogen gas is provided to the processing chamber at a flowrate of 8,000 sccm, acetylene gas at 200 sccm, and plasma power is applied at 1,600 W at a temperature of 400° C. and a pressure of 6.5 mTorr for 40 sec. to produce a treated tungsten surface having good adhesion to a carbon resistive layer.

At 406 a carbon containing layer is formed on the nitrogen rich surface of the first metal contact. The carbon containing layer is generally formed using a CVD or PVD process, with or without plasma assistance, and has a thickness between about 100 Å and about 5,000 Å, such as between about 300 Å and about 1,000 Å, for example about 500 Å. In one aspect the carbon containing layer may be an amorphous carbon layer. In another aspect the carbon containing layer may be doped with a dopant selected to shift the electrical properties of the carbon containing layer permanently by migrating through the carbon layer when an electric field is applied.

In one aspect, the carbon containing layer may be formed in the same chamber that the nitrogen rich surface of 404 is formed. Flow of the nitrogen containing gas mixture may be stopped and flow of a carbon containing gas mixture started to begin depositing the carbon containing layer. In an embodiment such as that described above wherein the nitrogen containing precursor also contains carbon, the nitrogen containing components of the gas mixture may be stopped while the carbon containing components are continued.

At 408, a second metal contact is formed on the carbon containing layer. As described in connection with other embodiments above, the second metal contact may be the same composition as the first metal contact, or a different composition generally comprising one or more of the same metals, metal mixtures or alloys, and metal compounds, and may be formed in the same chamber as the first metal contact or in a different chamber, by a PVD or CVD process, with or without plasma assistance. Forming a second metal contact having a thickness between about 20 Å and about 1,000 Å, such as between about 50 Å and about 500 Å, for example about 100 Å completes a core resistive memory device.

Formation of the second metal contact may be preceded by a nitrogen addition treatment to add nitrogen to the interface between the carbon containing layer and the second metal contact, if desired, to promote adhesion of the second metal contact to the carbon containing layer. In one embodiment, the carbon containing layer is subjected to the same surface treatment performed on the first metal contact layer before depositing the carbon containing layer. In another embodiment, the carbon containing layer may be exposed to a nitrogen plasma to add nitrogen to the carbon containing surface.

Figure 5A:
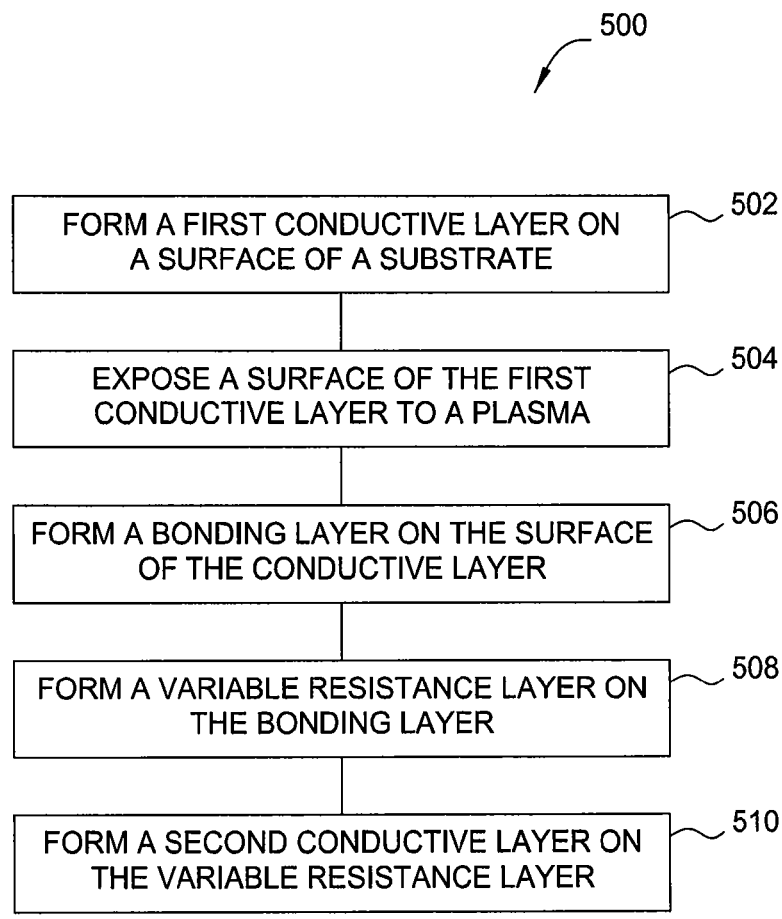
FIG. 5A is a flow diagram summarizing a method according to another embodiment.
Figure 5B:
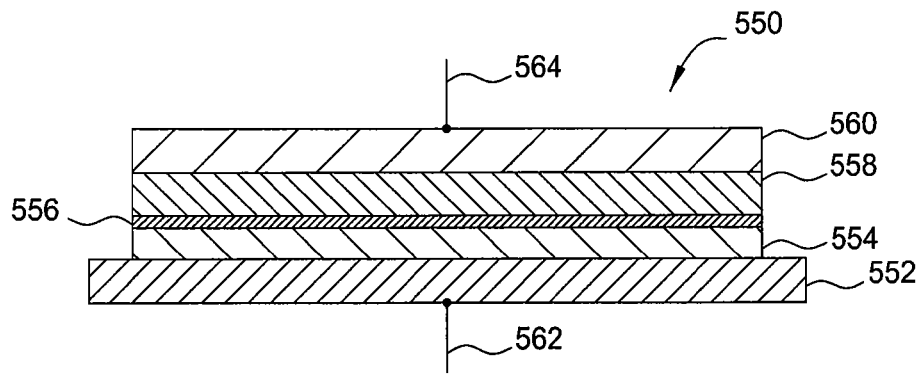
FIG. 5B is a schematic cross-sectional view of a device made by the method of FIG. 5A.

FIG. 5A is a flow diagram summarizing a method 500 according to another embodiment. FIG. 5B is a schematic cross-sectional view of a device 550 formed by the method 500 of FIG. 5A. At 502, a first conductive layer is formed on a surface of a substrate according to any of the embodiments described above in connection with FIGS. 1-4. FIG. 5B shows the first conductive layer 554 formed on the substrate 552.

At 504, a surface of the first conductive layer is exposed to a plasma. The plasma exposure adds adhesion promoting materials to the surface of the first conductive layer to improve adhesion of subsequent layers. The plasma may contain nitrogen, oxygen, carbon, or any mixture thereof. The plasma may be formed by applying electromagnetic energy to a precursor gas mixture to ionize the gas mixture. The electromagnetic energy may be applied in-situ or remotely as an electric field, a magnetic field, or as electromagnetic radiation. An electric field may be applied as a DC, pulsed DC, or RF field. A magnetic field may be applied by powering an inductive core using DC, pulsed DC, or RF power. Electromagnetic radiation of UV, microwave, or infrared (thermal) frequencies may be applied to the gas, as well. In one embodiment, a plasma is formed in-situ by connecting a source of RF power to the gas distributor of the process chamber, to the substrate support, or both. The RF power may be connected through an impedance matching network, as is known in the art. In most embodiments, RF voltage between about 100 V and about 5 kV, applied at a power level between about 500 W and about 5 kW, will generate a plasma in the process chamber.

Nitrogen compounds useful for forming a plasma containing nitrogen include $N_2$, $NH_3$, $NO_2$, and $H_2N_2$. Carbon compounds useful for forming a plasma containing carbon include $CH_4$, $C_2H_6$, $C_2H_4$, and $C_2H_2$. Oxygen compounds useful for forming a plasma containing oxygen include oxygen gas ($O_2$), ozone ($O_3$), carbon monoxide (CO), carbon dioxide ($CO_2$), and $NO_2$.

At 506, a bonding layer is formed on the surface of the conductive layer. The bonding layer may be formed by depositing ions from the plasma on the surface. The ions may be accelerated toward the substrate support by applying an electrical bias to the substrate support using DC, pulsed DC, or RF power. The ions may additionally be embedded in, or implanted in, the surface by using a bias strong enough to drive the ions into the surface to a desired depth. Using a weak bias, or no bias, may deposit the ions on the surface without embedding or implanting them. In one embodiment, an RF electrical bias of between about 50 V and about 100 V is delivered at a power level less than about 500 W, such as between about 100 W and about 300 W. FIG. 5B shows a bonding layer 556, which may be any embodiment of a bonding layer, including those described herein, formed on the surface of the first conductive layer 554.

A bonding layer is formed by depositing a material selected to form an adhesive bond with a subsequently deposited layer. In one aspect, adding oxygen to the surface of the conductive layer, such as by adding a stoichiometric excess of oxygen, may provide a foundation for chemical bonding with atoms from the subsequently deposited layer. In another aspect, adding nitrogen to the surface may provide a foundation for atoms from the subsequently deposited layer to intermingle with, or dissolve into, the bonding layer. Adding carbon to the bonding layer may improve adhesion with a subsequently deposited carbon containing layer. The bonding layer may have a thickness between about 0 Å and about 500 Å, such as between about 50 Å and about 150 Å, for example about 100 Å.

At 508, a variable resistance layer is formed on the bonding layer. The variable resistance layer may be formed by any of the methods described above in connection with FIGS. 1-4, and may comprise a metal oxide, a metal nitride, carbon, or any mixture thereof. A metal oxide variable resistance layer may adhere favorably to a bonding layer having a stoichiometric excess of oxygen, while a carbon containing variable resistance layer may adhere favorably to a nitrogen containing bonding layer, or to a nitrogen and carbon containing bonding layer. The variable resistance layer is generally formed having a thickness between about 100 Å and about 5,000 Å, such as between about 300 Å and about 1,000 Å, for example about 500 Å. In one embodiment, an amorphous carbon layer is formed by plasma deposition from any of the carbon precursors described above. The amorphous carbon layer adheres favorably to a tungsten substrate having a nitrogen and carbon containing bonding layer deposited thereon by exposure to a plasma of nitrogen gas and acetylene gas, similar to embodiments described above. The bonding layer may have a thickness of up to about 500 Å. FIG. 5B shows a variable resistance layer 558 formed on the bonding layer 556.

At 510 a second conductive layer is formed on the variable resistance layer, in similar fashion to the methods described above. FIG. 5B shows the second conductive layer 560 formed on the variable resistance layer 558. Contacts 562 and 564 of FIG. 5B connect the device 550 of FIG. 5B to external circuits.

Figure 6:
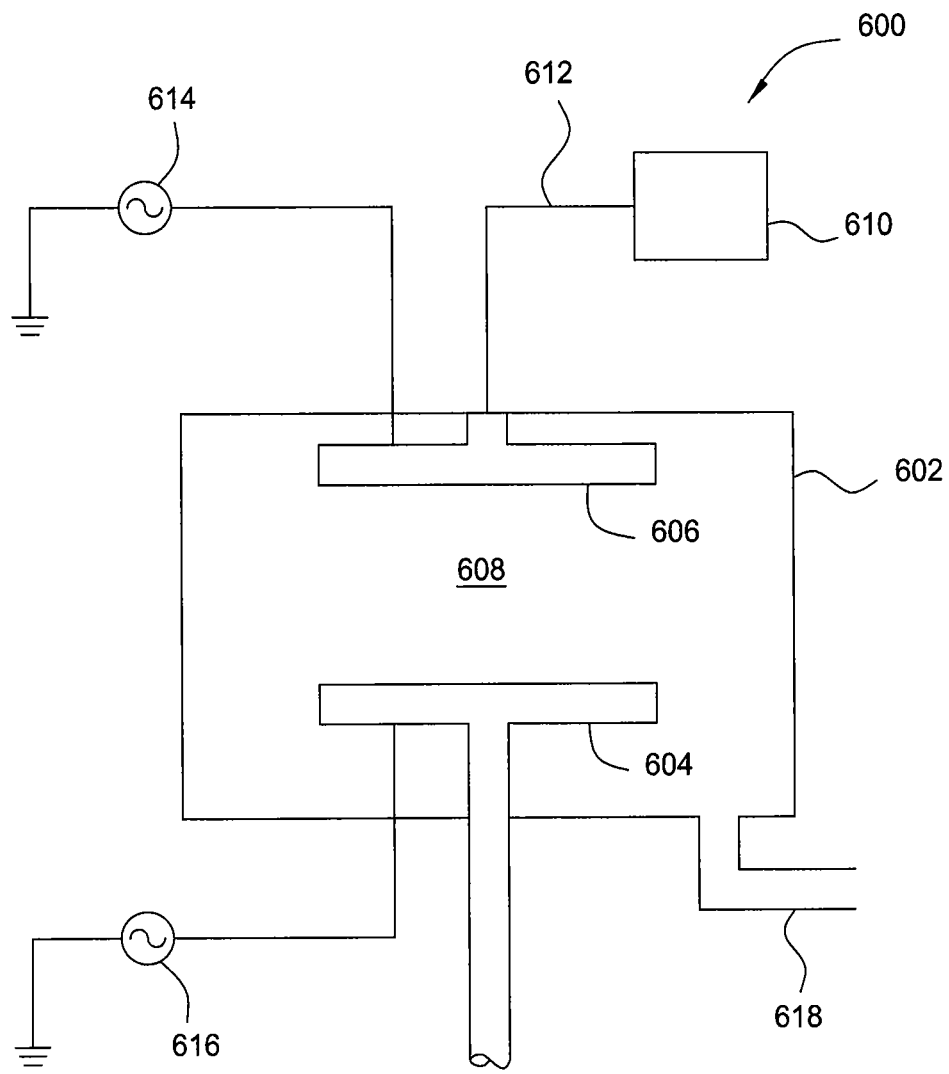
FIG. 6 is a schematic cross-sectional view of an apparatus for practicing embodiments described herein.

FIG. 6 is a schematic cross-sectional view of an apparatus 600 that may be used to practice embodiments described herein. The apparatus 600 comprises an enclosure 602 that defines a processing area 608. A support 604 is disposed in the processing area 608. Gases are provided through a gas distributor 606 that faces the support 604. The gases are provided through a representative conduit 612 from a gas source 610. Multiple gas sources and conduits may be used to deliver gases to the chamber. Gases exit the chamber through outlet conduit 618, which is generally coupled to the suction of one or more vacuum pumps. The gases may be ionized by applying power to the gas distributor 606 from the power source 614, or to the support 604 from power source 616. Ions may be accelerated toward the support 604 by creating an electrical bias on the substrate support using one or both power sources. It should be noted that the power source 614 may be used to apply a voltage to the gas distributor 606, or to an inductive core (not shown) proximate to the gas distributor. The inductive core generates a plasma by applying a magnetic field to the gases in the chamber.

While the foregoing is directed to embodiments of the invention, other and further embodiments of the invention may be devised without departing from the basic scope thereof.

What is claimed is:

1. A method of forming an electronic device, comprising:
   forming a metal-containing layer on a substrate;
   removing a surface layer from the metal-containing layer;
   exposing a surface of the metal-containing layer to a plasma to incorporate a bonding material into the surface of the metal-containing layer to improve adhesion of the metal-containing layer to subsequent layers, wherein the bonding material comprises carbon and nitrogen; and
   depositing a carbon-containing layer in contact with the surface of the metal-containing layer incorporating the bonding material, wherein the bonding material improves adhesion of the metal-containing layer to the carbon-containing layer.

* * * * *